US010101384B2

(12) United States Patent
Kalberer et al.

(10) Patent No.: US 10,101,384 B2
(45) Date of Patent: Oct. 16, 2018

(54) SIGNAL CONVERTER CIRCUIT AND METHOD FOR EVALUATING A SENSOR SIGNAL OF A SAFETY-ORIENTED DEVICE

(71) Applicant: FESTO AG & Co. KG, Esslingen (DE)

(72) Inventors: Roland Kalberer, Kirchheim (DE); Martin Hommel, Leonberg (DE)

(73) Assignee: FESTO AG & CO. KG, Esslingen (DE)

( * ) Notice: Subject to any disclaimer, the term of this patent is extended or adjusted under 35 U.S.C. 154(b) by 0 days.

(21) Appl. No.: 15/200,235

(22) Filed: Jul. 1, 2016

(65) Prior Publication Data

US 2017/0010319 A1  Jan. 12, 2017

(30) Foreign Application Priority Data

Jul. 10, 2015 (DE) .......................... 10 2015 212 934

(51) Int. Cl.
*G01R 31/28* (2006.01)
*H03K 3/0233* (2006.01)

(52) U.S. Cl.
CPC ................................ *G01R 31/2829* (2013.01)

(58) Field of Classification Search
CPC .. G01R 31/28; G01R 31/282; G01R 31/2829; G01R 19/0038; H03K 3/02337; G05B 9/00–9/03
See application file for complete search history.

(56) References Cited

U.S. PATENT DOCUMENTS

| 3,431,557 | A | | 3/1969 | Thomas et al. | |
| 3,551,824 | A | | 12/1970 | Rotier | |
| 4,086,541 | A | * | 4/1978 | Katou | H03F 3/45479 330/258 |
| 5,981,918 | A | * | 11/1999 | Topp | B60N 2/5685 219/202 |
| 6,098,011 | A | * | 8/2000 | Scott | G05B 9/03 318/564 |
| 6,382,740 | B1 | * | 5/2002 | Peichl | B60T 8/36 303/122.08 |

(Continued)

FOREIGN PATENT DOCUMENTS

DE   102007039835   2/2009

*Primary Examiner* — Huy Q Phan
*Assistant Examiner* — David Frederiksen
(74) *Attorney, Agent, or Firm* — Hoffmann & Baron, LLP

(57) ABSTRACT

A signal converter circuit includes a sensor connection, two comparator circuits, each having a signal input for an electric connection to the sensor connection, a reference input for an electric connection to a respectively assigned reference signal source and a signal output for a provision of an output signal, with a feedback line being formed between the respective signal output and the respective reference input, and further including two reference signal sources, each of the comparator circuits being configured for comparing a signal level at the signal input to a signal level at the reference input and for outputting a digital output signal as a function of a comparison result between the signal levels, wherein the two reference signal inputs are connected to one another via a coupling line being configured to transmit a presettable fraction of the respective signal level present at one reference input to the other reference input.

5 Claims, 2 Drawing Sheets

(56) References Cited

U.S. PATENT DOCUMENTS

| | | | | |
|---|---|---|---|---|
| 7,124,041 B1* | 10/2006 | Johnson | ................... | G05B 9/02 |
| | | | | 702/58 |
| 9,810,734 B2* | 11/2017 | Maeda | ............... | G01R 31/2829 |
| 2003/0184380 A1* | 10/2003 | Mulder | ................. | H03H 11/32 |
| | | | | 330/258 |
| 2005/0285619 A1* | 12/2005 | Williams | ............... | H02M 1/32 |
| | | | | 324/764.01 |
| 2012/0274381 A1* | 11/2012 | Pyo | ................... | G01R 33/0029 |
| | | | | 327/307 |
| 2013/0207665 A1* | 8/2013 | Bandyopadhyay | .... | G01R 31/02 |
| | | | | 324/537 |
| 2015/0053507 A1* | 2/2015 | Kattainen | ................ | B66B 1/32 |
| | | | | 187/288 |
| 2015/0236648 A1* | 8/2015 | Ahmad | ................ | H03F 1/3211 |
| | | | | 330/84 |
| 2016/0033984 A1* | 2/2016 | Lee | ........................ | G05F 1/575 |
| | | | | 323/280 |

\* cited by examiner

SIGNAL CONVERTER CIRCUIT AND METHOD FOR EVALUATING A SENSOR SIGNAL OF A SAFETY-ORIENTED DEVICE

BACKGROUND OF THE INVENTION

The invention relates to a signal converter circuit for processing a sensor signal into an output signal, the circuit comprising a sensor connection for receiving a sensor signal, further comprising two comparator circuits, each having a signal input for an electric connection to the sensor connection, a reference input for an electric connection to a respectively assigned reference signal source and a signal output for a provision of an output signal, with a feedback line being formed between the respective signal output and the respective reference input, and further comprising two reference signal sources, each of which is configured to provide a reference signal, each of the comparator circuits being configured to compare a signal level at the signal input to a signal level at the reference input and for outputting a digital output signal as a function of a comparison result between the signal levels. The invention further relates to a method for evaluating a sensor signal of a safety-oriented device.

From German Patent Application DE 1 499 505, which is published for opposition, a monitoring device for a redundant circuit arrangement is known, in which between two transmission lines there is in each case connected a comparison element, at the output of which an alarm switching device connected to all comparison elements is provided; this responds if the output signal of at least one comparison element exceeds a preset limit value, wherein an alternating voltage is used for the control signal and a differential amplifier serves as a comparison element, wherein the output of the differential amplifier is connected to a bistable circuit at the output of which the alarm switching device connected to all bistable circuits is switched, and wherein a connecting line with two branches, the first of which branches, which contains a diode, is connected to a first input of the bistable circuit, and the second of which branches, which contains a parallel circuit of a capacitor and a Zener diode, is connected to a second input of the bistable circuit, is located between the differential amplifier and the bistable circuit, and wherein a reverse bias lower than the breakdown voltage of the Zener diode is applied to the diode.

SUMMARY OF THE INVENTION

The invention is based on the problem of providing a signal converter circuit and a method for evaluating a sensor signal of a safety-oriented device, in which an improved identification of different functional states for the safety-oriented device is ensured.

For a signal converter circuit of the type referred to above, this problem is solved by the following features: the two reference inputs are electrically connected to one another via a coupling line, the coupling line being configured to transmit a presettable fraction of the respective signal level present at one reference input to the other reference input. With the aid of the coupling line, it is accomplished that, at a change of a signal level at the signal output of one of the comparator circuits, which may for example be due to a change of a signal level at the signal input, there occurs a presettable influence on a signal level at the reference input of the other comparator circuit, which basically operates in a redundant manner By a suitable design of the coupling line, this influence is preferably limited to a fraction of the respective signal level, for example to 10 percent. As a result of the preferably bidirectional coupling of the at least two comparator circuits via the coupling line, tolerances of the two comparator circuits can to the greatest extent be eliminated in evaluating the sensor signal. These tolerances are for example due to the properties of the electric and electronic components of the respective comparator circuit and to the properties of any upstream filter arrangements. The coupling of the at least two comparator circuits has the purpose of obtaining, while maintaining an at least singly redundant signal conversion, at least two output signals which are always the same irrespective of the unavoidable tolerances in the respective comparator circuits and on condition that the respective comparator circuits function correctly. In order to maintain redundancy in signal conversion irrespective of the coupling provided, it has to be ensured that the fraction of the signal level provided by one comparator circuit via the coupling line to the respective reference input of the other comparator circuit is greater than the tolerances of the electric and electronic components of the respective comparator circuit but lower than a switching hysteresis of the respective comparator circuit. If these marginal conditions are met, there will always be clear and identical output signals of the comparator circuits irrespective of their unavoidable tolerances. These output signals can be supplied to a downstream comparator which is tasked with evaluating the sensor signal from the incoming output signals and with initiating further measures depending on a result of this evaluation. It may for example be provided that the sensor signal is supplied for safeguarding a machine by a safety-oriented device, in particular an emergency stop button on a machine or a light curtain, and that the machine is stopped at a presettable signal level of the sensor signal in order to avoid damage. Depending on the safety level aimed at, a singly redundant processing of the input signal into two output signals can be achieved with two comparator circuits, or a multiply redundant processing of the input signal into at least three output signals can be achieved with at least three comparator circuits.

Advantageous further developments of the invention form the subject matter of the dependent claims.

It is expedient if a series connection of two preferably identical attenuation means from the group consisting of: resistor, capacitor is provided in the coupling line. The attenuation means have the purpose of providing only a presettable fraction of the reference signal present at a reference input to the at least one other reference input, so that an influence between the at least two comparator circuits is limited in such a way that the desired redundancy in the evaluation of the sensor signal is not compromised.

It is preferably provided that the attenuation means are designed as failsafe electric components in order to reduce the coupling action for the coupling line in case of a fault. In this context, a fault is to be understood as a malfunction of the attenuation means, which may for example be caused by an electric overload of the attenuation means, in particular by external impact of electromagnetic fields, and/or by aging and/or by mechanical loads at the attenuation means. In order to ensure the safety-oriented properties of the signal converter circuit even on the occurrence of such effects, the attenuation means are constructed in such a way that the coupling action between the reference inputs can only be reduced and not increased in case of a fault. In the extreme case, this may have the result that the coupling action between the reference inputs is cancelled completely, because the attenuation means located in the coupling line do not permit any signal transmission because of a fault. In this situation, the signal converter circuit operates in the same way as signal converter circuits of prior art.

In an advantageous further development of the invention, it is provided that the attenuation means is selected from the group consisting of: MELF resistor, thin-film resistor, capacitor with fail-open characteristics. A MELF (metal electrode leadless faces) resistor is an electric component, designed for surface-mounting in particular, in a usually cylindrical shape, the end faces of which are designed as electric contacts and which has a precisely defined behavior in case of a fault. If there is a fault, a MELF resistor can become high-impedance, but there will be no reduction of its resistance. In a thin-film resistor, the resistance layer is applied to a substrate in such a way that an aging or an electric overload of the resistor results in an increase of its resistance. A capacitor with fail-open characteristics is configured in the same way, so that in case of a fault its capacitance can only decrease and not increase.

In a further variant of the invention, it is provided that each of the comparator circuits is designed as a Schmitt trigger, in particular with a comparator or operational amplifier, and/or for a redundant processing of the sensor signal. In redundant—if applicable multiply redundant—processing, the input signal is processed with two—if applicable more—comparator circuits in an at least substantially identical way and fed to a downstream signal evaluation device. The signal evaluation device compares the at least two input signals processed into output signals in order to ensure a higher security level for this signal evaluation and the measures to be derived there from, for example the output of a stop signal for a machining unit.

The problem of the invention is solved by a method comprising the following steps: a provision of a sensor signal of a safety-oriented device to a plurality of signal converter circuits, a comparison of a signal level of the sensor signal to a signal level at a reference input of the respective signal converter circuit, wherein a signal level at the respective reference connection is formed from a reference signal of a respectively assigned reference signal source, an output signal from a signal output of the respective signal converter circuit and a coupling signal from a reference input of a further signal converter circuit, and wherein the coupling signal is provided as a presettable fraction of the signal level by a reference input of the further signal converter circuit, a forwarding of the output signals to a comparator and a provision of a fault signal by the comparator if the output signals consistently lie within a presettable level interval or if the output signals show a deviation greater than a presettable level difference for longer than a presettable test interval.

BRIEF DESCRIPTION OF THE DRAWINGS

An advantageous embodiment of the invention is shown in the drawing, of which.

DETAILED DESCRIPTION

Figure 1:
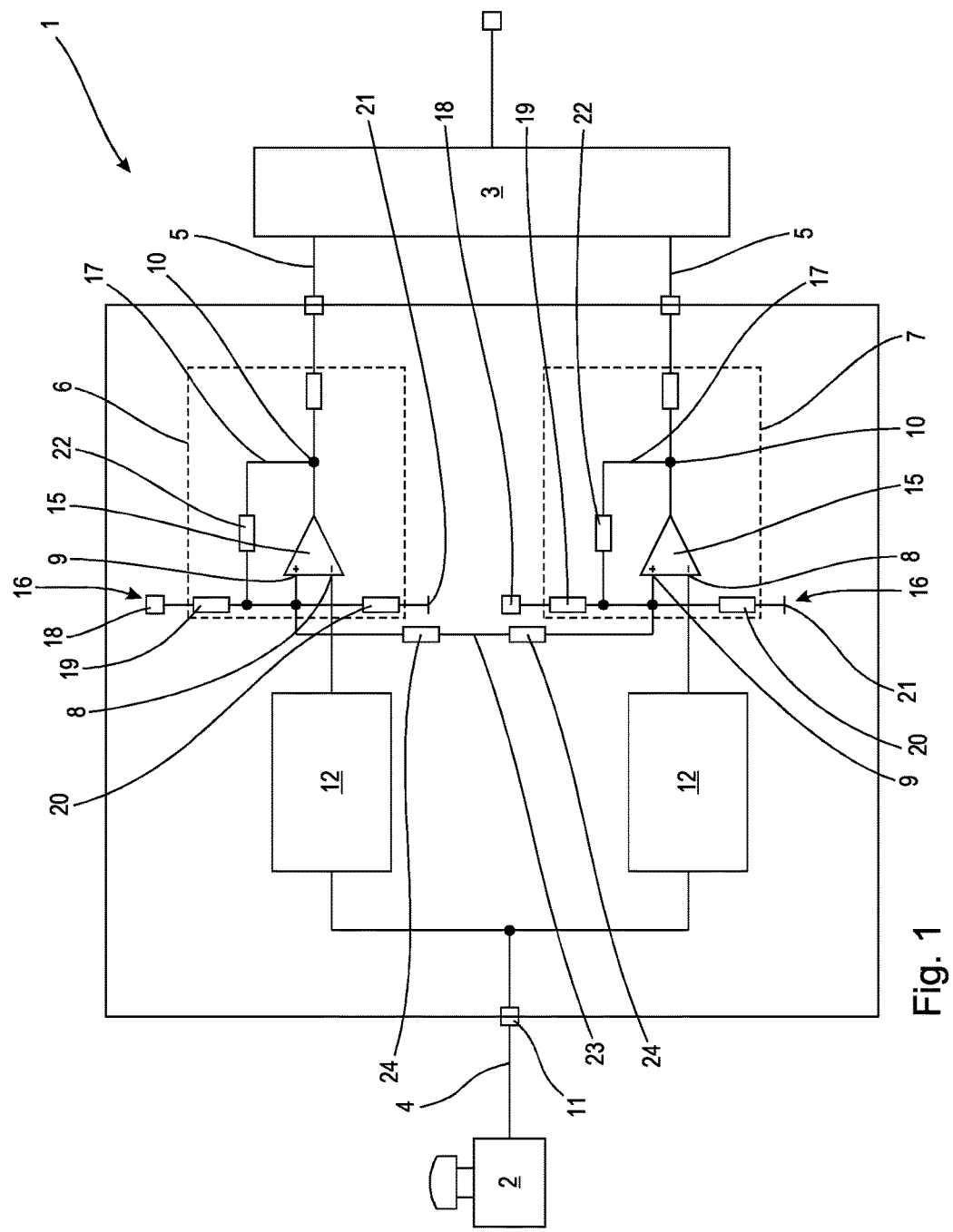
FIG. 1 is a block diagram of the signal converter circuit with a redundant arrangement of two comparator circuits which are electrically coupled to one another.

A signal converter circuit 1 as shown in FIG. 1 is electrically looped between a sensor 2 and a comparator 3 by way of example. In the illustrated embodiment, the sensor 2 is designed as an emergency stop button, with the aid of which an operator can switch off a machining unit not shown in the drawing in order to reduce or eliminate any potential hazard posed by the machining unit. To facilitate as reliable as possible an evaluation of the sensor signal provided by the sensor 2 and transmitted to the signal converter circuit 1 by the comparator 3, which is in turn connected in a way not shown in detail to a switching device for influencing the machining unit, the signal converter circuit 1 of the illustrated embodiment has a structure described in greater detail below.

The signal converter circuit 1 has the task of converting the sensor signal provided by the sensor 2, which may in particular be an analogue voltage signal or an analogue current signal, into a digital output signal which can adopt two easily distinguished signal states (low, high) and which is fed to the comparator 3 via output lines 5.

For this purpose, the signal converter circuit 1 has, by way of example, a singly redundant arrangement of two comparator circuits 6, 7, which are constructed identically merely by way of example. Each of the comparator circuits 6, 7 has a signal input 8, a reference input 9 and a signal output 10. The signal input 8 is electrically connected to a sensor connection 11, to which the sensor line 4 is connected. Between the sensor connection 11 and the signal input 8 of the respective comparator circuits 6, 7, there is provided a filter circuit 12, which is shown only diagrammatically in the illustrated embodiment and in which the sensor signal provided at the sensor connection 11 is processed for the respective comparator circuits 6, 7 in a suitable, in particular identical, manner In the illustrated embodiment, it is provided that the comparator circuits 6, 7 are designed as Schmitt triggers. Each of the comparator circuits 6, 7 therefore comprises a comparator or operational amplifier 15, a reference signal source 16 electrically connected to the reference input 9 and a feedback line 17 formed between the signal output 10 and the reference input 9. In the illustrated embodiment, the reference signal source 16 is designed as a voltage divider and comprises a first resistor 19 connected to a voltage source 18 and the reference input 9 and a second resistor 20 connected to the reference input 9 and an earth connection 21. The further description is accordingly based on the assumption that a signal level which is at least substantially influenced by the characteristics if the reference signal source 16 is present at the reference input 9.

The reference input 9 is further connected to the signal output 10 via a resistor 22 looped into the feedback line 17, the resistor 22 being dimensioned such that a presettable fraction of a signal level present at the signal output 10 is fed back to the reference input 9.

In addition, the comparator circuits 6, 7, which are connected in parallel in respect of the sensor signal provided at the sensor connection 11 and which are designed for an independent conversion of the sensor signal, are electrically connected to one another by a coupling line 23. The coupling line 23 runs between the reference inputs 9 of the two comparator circuits 6, 7. In order to limit a mutual influencing of the two comparator circuits 6, 7 to a presettable degree, two attenuation means 24 connected in series are looped into the coupling line of the illustrated embodiment. The attenuation means 24 facilitate a bidirectional coupling-in of signals from one reference input 9 to another reference input 9. Owing to the use of two series-connected attenuation means 24, a higher security level can be obtained for the signal converter circuit 1 than if only one attenuation means were used. If the security level to be obtained is not critically important, a single attenuation means can be provided. In the illustrated embodiment, the two attenuation means 24 are identically designed as MELF resistors, in which aging and electric overload occurring in case of a fault invariably result, because of internal and/or external voltage and/or current couplings, in an increase of resistance and thus in a reduction of the coupling effect between the reference inputs 9.

In this arrangement, the series connection of the attenuation means 24 is matched to the signal levels present at the reference inputs 9 in such a way that the positive feedback or co-influencing of the respective comparator circuits 6, 7 does not exceed a presettable coupling level. By coupling the two comparator circuits 6, 7, tolerances can be compensated. These tolerances are due to the electric and electronic components of the respective comparator circuits 6, 7 and, if applicable, of the upstream filter circuits 12 and can, without positive feedback, result, irrespective of an identical sensor signal at the respective signal inputs 8 of the two comparator circuits 6, 7, in different output signals at the signal outputs 10 of the two comparator circuits 6, 7.

Figure 2:
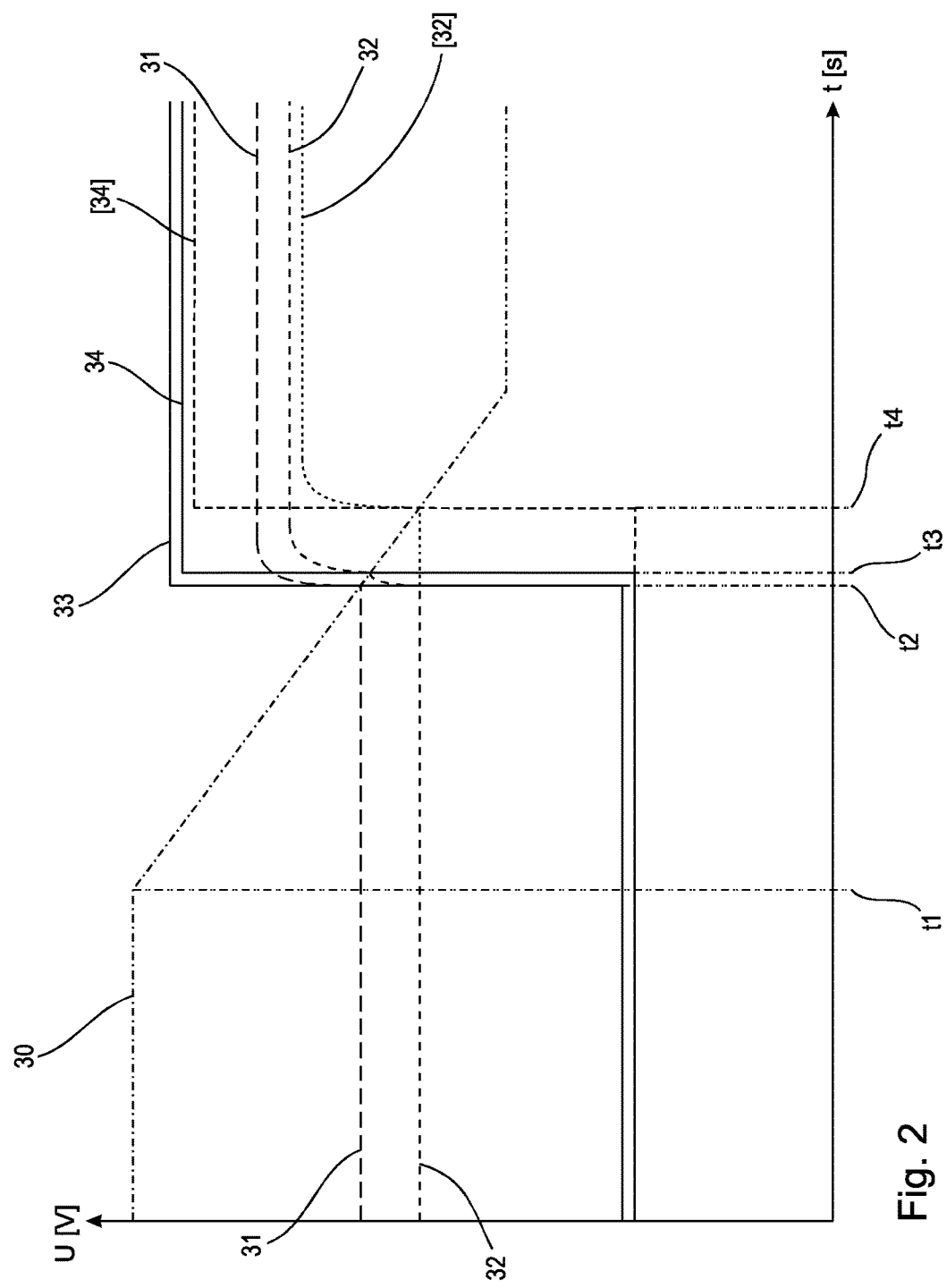
FIG. 2 shows a diagrammatic signal course for the comparator circuit according to FIG. 1.

The following description of the function of the signal converter circuit 1 shown in FIG. 1, which also refers to the signal course shown in FIG. 2, is based on the assumption that an identical signal level is present at the signal inputs 8 of the comparator circuits 6, 7. By way of example, it is further assumed that the two comparator circuits 6, 7 have a slightly different switching behavior due to component tolerances, so that a switching threshold 31 of the comparator circuit 6 for switching the signal output 10 from a logic high signal level to a logic low signal level is higher than a switching threshold 31 of the comparator circuit 7.

Owing to the configuration of the a switching threshold 31 of the comparator circuits 6, 7 as Schmitt triggers, the comparator circuits 6, 7 further have a switching behavior liable to hysteresis, so that a change-over from a first signal level for the output signal to a second signal level for the output signal always requires a presettable signal difference between a chronologically earlier and a chronologically later signal level at the signal input.

Owing to the configuration of the a switching threshold 31 of the comparator circuits 6, 7 as Schmitt triggers, the comparator circuits 6, 7 are configured for comparing the sensor signal level present at the respective signal input 8 to a reference signal level present at the respective reference input.

As has been explained with reference to FIG. 1, the reference inputs 9 of the two comparator circuits 6, 7 are electrically connected to one another via the coupling line 23. In addition, owing to their configuration as Schmitt triggers, a feedback of the output signal level 33, 34 to the respective reference input 9 via the respective feedback lines 17 is provided for each of the comparator circuits 6, 7. The result is a reference signal level (not shown) at the respective reference input as a combined signal level from the voltage level made available by the reference signal source 16 together with the output signal provided via the feedback line 17 and the reference signal at the other reference input 9, which is provided by the respective other reference input 9 and attenuated with the aid of the attenuation means 24.

The following description of an exemplary switchover process is based on the assumption that the sensor signal is at a high voltage level up to a point in time t1 and after the point in time t1 drops to a lower voltage level as a result of a manual actuation of the sensor 2. As a result of shortcomings in the signal transmission between the sensor 2 and the comparator circuits 6, 7, the sensor signal is changed from the point in time t1 by the actuation of the sensor 2 not suddenly, but rather in accordance with the signal curve of the sensor signal level 30 according to FIG. 2.

At the point in time t2, the sensor signal level 30 reaches the switching threshold 31 of the first comparator circuit 6, so that at this point the output signal level 33 of the first comparator circuit 6 is switched from low to high. Without any coupling of the reference inputs of the two comparator circuits 6, 7, the output signal level 34 of the second comparator circuit 7 would only be switched from low to high at a point in time t4, because the sensor signal level 30 does not undershoot the switching threshold 32 of the second comparator circuit 7 before this point in time.

Depending on the design of the comparator 3, the time difference between the changes of the output signal levels of the two comparator circuits 6, 7 would be evaluated as a fault or result in a time-delayed response of the comparator 3 with the disadvantage of a delayed reaction, which may for example be the shutdown of the machining unit not shown in the drawing.

If, on the other hand, the comparator circuits 6, 7 are connected to one another in terms of their reference inputs 9 via the coupling line 23 as shown in FIG. 1, the switchover of the comparator circuit 6 at the point in time t2 leads to a rise in the output signal level 33 provided at the signal output of this comparator circuit 6 in the illustrated embodiment. This output signal level 33 is made available to the comparator 3 on the one hand and, via the feedback line 17, to the reference input 9 of the comparator circuit 6 on the other hand. In addition, this output signal level is made available by the reference input 9 of the comparator circuit 6 to the reference input 9 of the comparator circuit 7 via the coupling line 23.

Owing to the tolerance-related difference in its switching threshold 32 compared to the comparator circuit 6, the comparator circuit 7 does not yet perform a switchover operation at the point in time t2 before the arrival of the attenuated feedback signal of the comparator circuit 6 because of the difference between the signal level at the signal input 8 and the signal level at the reference input 9. However, the signal difference required for the switchover of the comparator circuit 7 is already reached at the point in time t3 as a result of the contribution of the, however small, proportion of the reference signal level of the comparator circuit 6 made available to the comparator circuit 7 via the coupling line 23, so that—compared to the variant without coupling via the coupling line 23—there is an earlier switchover of the comparator circuit 7 from a low level to a high level.

By way of example, it may be provided that a coupling action of the signal levels of the reference signals transmitted bidirectionally via the coupling line 23 does not exceed a proportion of, for example, 10 percent in order to eliminate an undesirable complete positive coupling between the redundantly operating comparator circuits 6, 7.

In the same way, the two comparator circuits 6, 7 can have switching thresholds (not shown) for switching the respective output signal level from high to low, so that, owing to the proportional coupling of the reference signal levels, there will be a time-coordinated switchover of the two comparator circuits 6, 7 even at a rise of the sensor signal level 30.

The invention claimed is:

1. A signal converter circuit for processing a sensor signal into an output signal, the circuit comprising a sensor connection for receiving the sensor signal, and further comprising a singly redundant arrangement of two comparator circuits, each comparator circuit having a signal input, a reference input and a signal output, wherein each signal input is electrically connected to the sensor connection, each reference input is electrically connected to a respectively assigned reference signal source and each signal output providing the output signal, with a feedback line being formed between the respective signal output and the respective reference input, and further comprising two reference signal sources, each reference signal source being electrically connected to one of the reference inputs of the two comparator circuits and being configured to provide a reference signal to the reference input, the two comparator circuits operating in a redundant manner whereby each of the comparator circuits is configured to compare a signal level at the signal input to a signal level at the reference input and to output a digital output signal as a function of a comparison result between the signal levels, wherein the two reference signal inputs are electrically connected to one another via a coupling line, the coupling line being configured to transmit a presettable fraction of the respective signal level present at one reference input to the other reference input.

2. The signal converter circuit according to claim 1, wherein the coupling line is a series connection of two attenuation means from the group consisting of: resistor, capacitor.

3. The signal converter circuit according to claim 2, wherein the attenuation means are designed as failsafe electric components in order to reduce the coupling action for the coupling line in case of a fault.

4. The signal converter circuit according to claim 3, wherein the attenuation means is selected from the group consisting of: MELF resistor, thin-film resistor, capacitor with fail-open characteristics.

5. The signal converter circuit according to claim 1, wherein each of the comparator circuits is designed as a Schmitt trigger and/or for a redundant processing of the sensor signal.

\* \* \* \* \*